United States Patent [19]

Hetherington

[11] Patent Number: 4,491,492

[45] Date of Patent: Jan. 1, 1985

[54] METHODS OF AND APPARATUS FOR APPLYING A SHEET TO A RIGID BOARD

[75] Inventor: Jack C. Hetherington, Richmond, Va.

[73] Assignee: AT&T Technologies, Inc., New York, N.Y.

[21] Appl. No.: 437,244

[22] Filed: Oct. 28, 1982

[51] Int. Cl.³ .................. B29C 17/04; B32B 3/04; B32B 31/00; B65C 9/04

[52] U.S. Cl. .................. 156/212; 156/213; 156/216; 156/264; 156/450; 156/485; 156/263; 156/521; 156/556; 156/559

[58] Field of Search .......... 156/212, 213, 216, 475, 156/483–485, 521, 263, 264, 449, 450, 556, 559

[56] References Cited

U.S. PATENT DOCUMENTS

| | | | |
|---|---|---|---|
| 2,995,360 | 8/1961 | Simpson | 271/27 |
| 3,598,675 | 8/1971 | Bofinger et al. | 156/450 |
| 3,658,629 | 4/1972 | Cramer et al. | 156/552 |
| 3,788,515 | 1/1974 | Middleman | 226/1 |
| 3,955,481 | 5/1976 | Heitmann | 156/521 |
| 3,980,293 | 9/1976 | Shelmire | 271/93 |
| 4,025,380 | 5/1977 | Bernardo | 156/497 |
| 4,124,429 | 11/1978 | Crankshaw | 156/449 |
| 4,127,436 | 11/1978 | Friel | 156/630 |
| 4,173,301 | 11/1979 | Turini et al. | 226/102 |
| 4,323,416 | 4/1982 | Malthouse et al. | 156/521 |

Primary Examiner—Edward Kimlin
Attorney, Agent, or Firm—J. B. Hoofnagle

[57] ABSTRACT

A pair of sheets (46 and 48) are held by vacuum on a pair of spaced drums (30 and 32). A rigid board (51) is moved between the drums (30 and 32) whereafter the drums are moved toward each other to adhesively attach leading edges of the sheets (46 and 48) to opposite sides of a leading edge (50) of the rigid board. As the board (51) is moved away from the drums (30 and 32), the drums are indexed to release successive sections of the sheets (46 and 48) which extends the sheets in a wrinkle-free condition. As the board (51) continues to be moved away from the drums (30 and 32), the successive sections of the sheets (46 and 48) are maintained spacially from the board and in the wrinkle-free condition by various facilities such as a vacuum shoe (52), a shelf (53), a vacuum tensioning tube (56) and vacuum bars (57 and 58). Eventually, the wrinkle-free successive sections of the sheets (46 and 48) are brought into engagement with the board (51) and attached thereto by laminating rollers (59 and 60).

2 Claims, 16 Drawing Figures

METHODS OF AND APPARATUS FOR APPLYING A SHEET TO A RIGID BOARD

TECHNICAL FIELD

This invention relates to methods of and apparatus for applying a sheet to a rigid board and more particularly to methods of and a laminator for precisely positioning and applying dry photoresist sheets to opposite sides of the rigid board.

BACKGROUND OF THE INVENTION

Apparatus, such as laminators, for applying photoresist material to opposite sides of a rigid board in the manufacture of printed wiring boards are well known in the art. Typically, the photoresist material, having a preselected width, is drawn from rolls and laminated to both sides of a plurality of rigid boards being fed in sequence between two sheets of the material. Thereafter, the individual rigid boards, which are connected together by a finite length of the material, must be separated by severing the material between the individual rigid boards. This procedure is time consuming and results in the formation of small particles and slithers of the material which frequently affects the efficient manufacture of and the subsequent utilization of the manufactured printed wiring boards. Moreover, the excess photoresist material between the boards must be discarded thus creating a waste of the material.

U.S. Pat. No. 3,658,629, which issued to L. P. Cramer et al., discloses a laminator which will cut sheets of the photoresist material and laminate them to panels within a defined perimeter. A pair of spaced drums each receive and vacuumly grip the leading section of photoresist material extending from two respective supply rolls. As each leading section of photoresist material is fed from the respective roll to the respective drum, a vacuum holds the material in place on the surface of the drum while a cutter operates at a predetermined location relative to the drum to sever the leading section from the roll to form a sheet of the photoresist material in a desired length. The leading edge of each sheet is then pressure sealed to a leading edge of the respective opposite sides of the panel. The panel is then moved through the laminator between, but spaced from, the drums as the sheets of material are pulled from the respective drums. As the panel emerges from between the drums, the sheets of material are held with the panel by the pressure seal along the leading edge and the natural adhesion characteristics of the resist material. Thereafter, the panel is fed between curing rollers to permanently secure the severed sheets of photoresist material to opposite sides of the panel.

During the latter stages of transfer of the sheets from the drums to the panel, the trailing portions of the sheets are released by the drums but are not in intimate contact with the moving panel due to the fact that the drums are spaced from the panel. Even though the sheets have been stretched between the drums and the moving panel, the trailing portions of the sheets are no longer held and would tend to assume a condition other than wrinkle-free as the trailing portions pass through space from the drums to the panel. While the leading portions of the sheets would appear to be secured to the panel in a wrinkle-free condition after passing between the curing rolls, it appears that the trailing portions of the sheets would tend to assume a less than wrinkle-free condition prior to passing between the curing rolls and, consequently, would be secured to the panel in that less-than-desired condition. Consequently, there is a need for a method of and apparatus for applying photoresist material to the rigid panel which precludes the development of wrinkles in the entire sheet of material as the sheet is being laminated to the panel.

SUMMARY OF THE INVENTION

This invention relates to methods of and apparatus for applying a sheet to opposite sides of a rigid board. A leading edge of the sheet is attached to a leading edge of the rigid board. A remaining portion of the sheet is extended above the rigid board to a substantially wrinkle-free condition and to prevent any premature attachment between the remaining portion of the sheet and the board. The extended and substantially wrinkle-free condition is maintained while securing sucessive sections of the remaining portion of the sheet to the board.

DETAILED DESCRIPTION

Figures 1, 2:
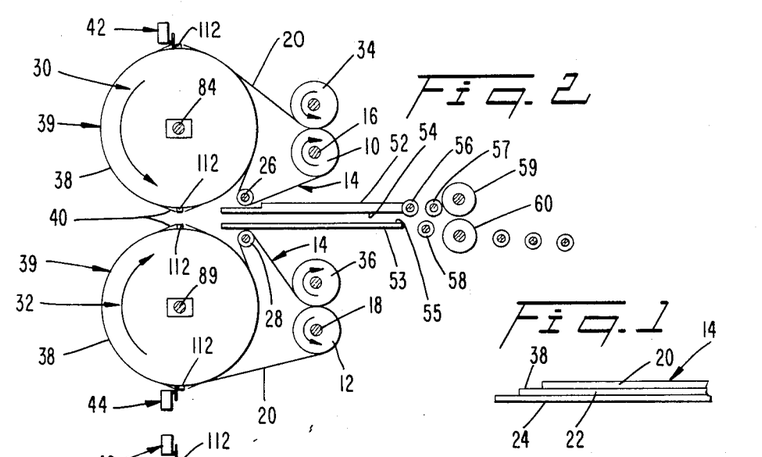
FIG. 1 is a side view of a portion of a dry film-photoresist composite.
FIGS. 2 through 10 are schematical side views of an apparatus showing the steps of applying sheets of a dry film-photoresist laminate to opposite sides of a rigid board embodying certain principles of the invention.

Referring to FIG. 2, supply rolls 10 and 12 of a dry film-photoresist composite, designated generally by the numeral 14, are mounted on arbors 16 and 18, respectively. As illustrated in FIG. 1, the composite 14 includes an upper layer 20 of plastic film, an intermediate layer 22 of photoresist material and a lower layer 24 of plastic film. The plastic film which forms layers 20 and 24 of composite 14 could be, for example, a plastic film sold under the trademark "Mylar." Referring again to FIG. 1, the composite 14 of each of the rolls 10 and 12 is threaded around idle rollers 26 and 28, respectively, and is secured to vacuum drums, designated generally by the numerals 30 and 32, respectively. A leading edge of each of the upper layers 20 of film of each of the rolls 10 and 12 is separated from the respective layer 22 and is secured to a respective one of a pair of take-up rollers 34 and 36. Thereafter, as vacuum drums 30 and 32 rotate in the direction indicated, the composite 14 is fed from supply rolls 10 and 12, respectively. While the upper layers 20 of film are collected on respective take-up rollers 34 and 36, the lower layer 24 of film and the layer 22 of photoresist material is positioned on each of the vacuum drums 30 and 32 so that an adhesive surface 38 (FIG. 1) of photoresist material is outwardly disposed on the vacuum drums. The layer 22 of photoresist material and layer 24 of film now form a laminate, designated generally by the numeral 39. The vacuum drums 30 and 32 are rotated until a leading edge 40 of each laminate 39 on each drum is aligned with and adjacent to each other. Thereafter, sheet severing systems, designated generally by the numeral 42 and 44, are activated to traverse drums 30 and 32, respectively, and sever the laminate 39 to form sheets 46 and 48 of the laminate.

Figure 3:
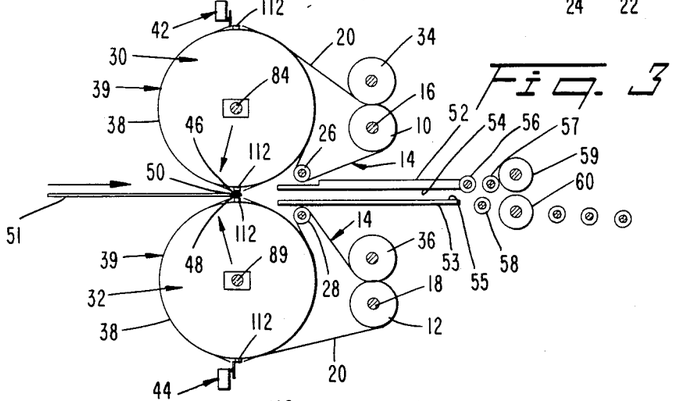

Referring to FIG. 3, a leading edge 50 of a rigid board 51 is positioned between vacuum drums 30 and 32 and is aligned with the leading edge 40 of each of the sheets 46 and 48 of the laminate 39. Vacuum drums 30 and 32 are moved in directions generally toward each other as illustrated by the arrows in FIG. 3 to facilitate the attachment of the leading edge 40 of the adhesive surface 38 of each of the sheets 46 and 48 to the leading edge 50 of respective opposite sides of the board 51. Vacuum drums 30 and 32 are then moved in directions away from the board 51 as illustrated by the arrows in FIG. 4. As noted above, sheets 46 and 48 are vacuumly held to drums 30 and 32. After the leading edges 40 of sheets 46 and 48 have been attached to the leading edge 50 of board 51, short portions 47 (FIG. 4) of each of the sheets, which are immediately adjacent to the leading edges 40, extend between the now-secured leading edges 40 and the leadingmost portion of the sheets which are vacuumly held by the drums 30 and 32. If the drums 30 and 31 had been moved vertically toward each other to attach the leading edges 40 of sheets 46 and 48 to the board 51 and were then retracted vertically, the short portions 47 of the leading sections of the sheets would have been stretched, and possibly torn, during retraction of the drums. To compensate for this deleterious effect, the drums 30 and 32 are moved in the biased directions as indicated by the arrows in FIGS. 3 and 4. As illustrated in FIG. 3, the drums 30 and 32 are moved generally toward each other but slightly to the left. This biased movement provides some slack in the short portions 47 of the sheets 46 and 48. As the drums 30 and 32 are retracted in the directions illustrated by the arrows in FIG. 4, the developed slack in short portions 47 permits the drums 30 and 32 to be fully retracted without stretching or tearing the short portions.

Figure 5:
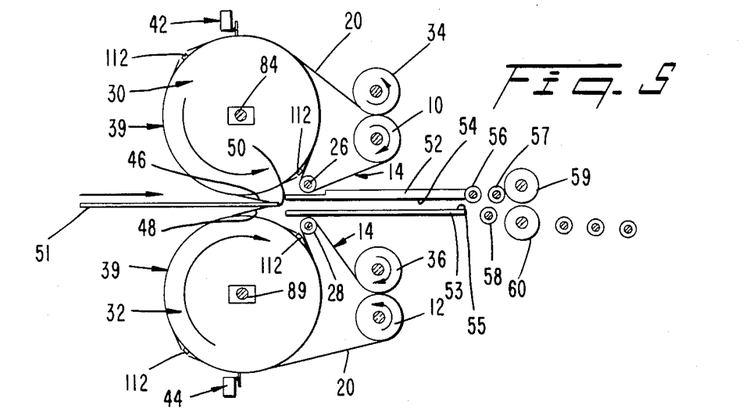
Figure 6:
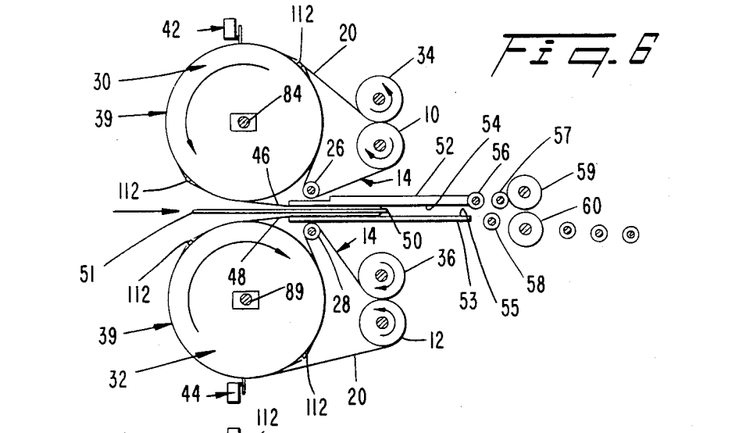
Figure 7:
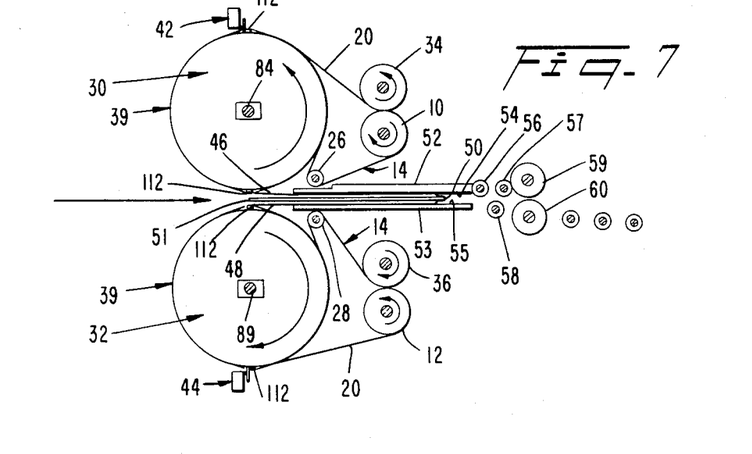
Figure 8:
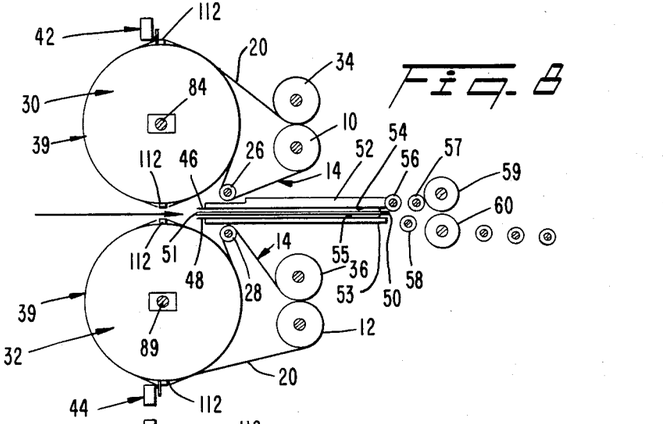

Thereafter, the board 51 is moved between the separated vacuum drums 30 and 32 by a conveyor system (not shown) as the vacuum drums rotate in the directions shown in FIG. 5. As the board 51 is moved between the vacuum drums 30 and 32, the distance between the drums and the board precludes any subsequent contact between the board and the remaining portion of each of the sheets 46 and 48. Further, as successive sections of the trailing or remaining portion of sheet 46 are released from drum 30, the sections are extended to a wrinkle-free condition. The leading edge 50 of the board 51 subsequently moves between a vacuum shoe 52 and a support shelf 53. Vacuum shoe 52 grips and holds the successive sections of the remaining portion of sheet 46 above the board 51 as the successive sections are extending from drum 30 to prevent any premature adhesive engagement with the board as illustrated in FIGS. 6, 7 and 8 other than at the leading edge 50 thereof and to maintain the successive sections in the wrinkle-free condition. Successive sections of the trailing or remaining portion of sheet 48 are released from drum 32 and are guided onto support shelf 53 whereby the weight of sheet 48 and gravitational forces preclude any premature adhesive engagement with the board 51 as the sheet is released from vacuum drum 32. In addition, the successive sections of the remaining portion of sheet 48 are extended as the leading edge 50 of the board 51 moves away from drum 32 to place the successive sections in a wrinkle-free condition.

Figures 9, 10, 11:
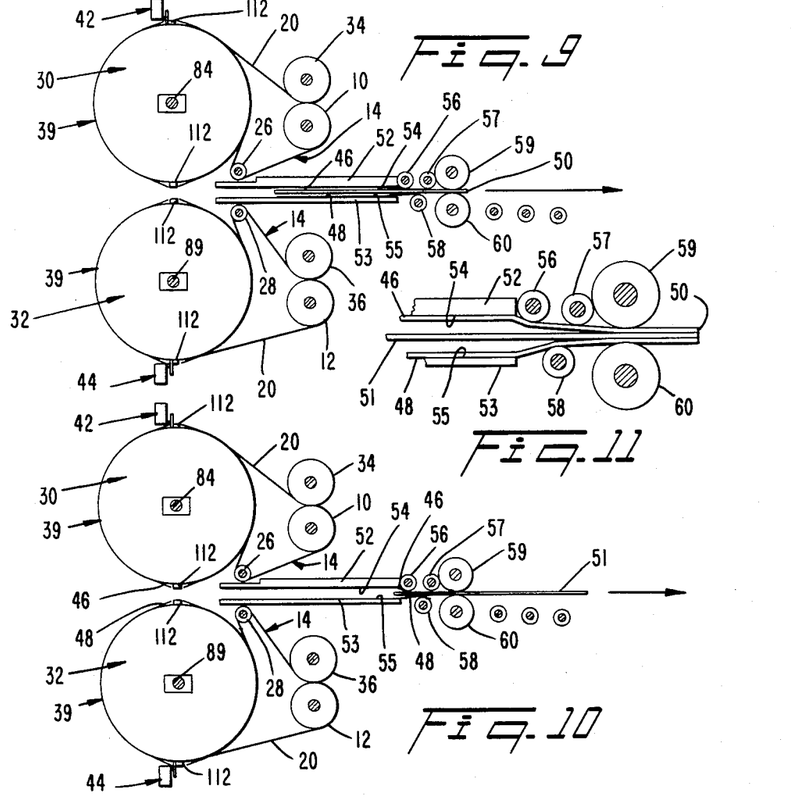
FIG. 11 is an enlarged portion of FIG. 9 showing the attachment of the sheets to the rigid board.

As the board 51 continues to move in the direction illustrated, the vacuum shoe 52 permits the successive sections of sheet 46 to be stepped along a lower vacuum-gripping surface 54 thereof but remain releasably retained thereby, while sheet 48 slides along an upper surface 55 of the shelf 53. A vacuum tensioning tube 56, which is positioned adjacent and forward of the shoe 52, facilitates the directing of the successive sections of the sheet 46 from the shoe and toward the board 51. As illustrated in FIGS. 9, 10 and 11, the board 51 is fed between a pair of vacuum bars 57 and 58 to facilitate further the gradual directing and converging of successive sections of sheets 46 and 48 in the wrinkle-free condition toward a location between a pair of laminating rollers 59 and 60. As the board 51 is fed between the pair of laminating rollers 59 and 60, the adhesive surfaces 38 of the wrinkle-free successive sections of sheets 46 and 48 are pressed into attachment with the board. As a result of the movement of the board 51, drums 30 and 32 have been indexed 180° to position the laminates 39 for severing by the sheet severing systems 42 and 44, respectively, to form the next set of sheets 46 and 48, respectively.

In this manner, sheet 46 is extended to a position above board 51 while preventing any premature attachment of the remaining portion of the sheet to the board while maintaining the remaining portion in the wrinkle-free condition. Further, sheet 48 is extended below board 51 in a similar fashion. The use and position of vacuum tension tube 56 and vacuum tensioning bars 57 and 58 facilitate the final and gradual directing of the successive sections of the wrinkle-free remaining portions of sheets 46 and 48 toward the board 51.

Figure 12:
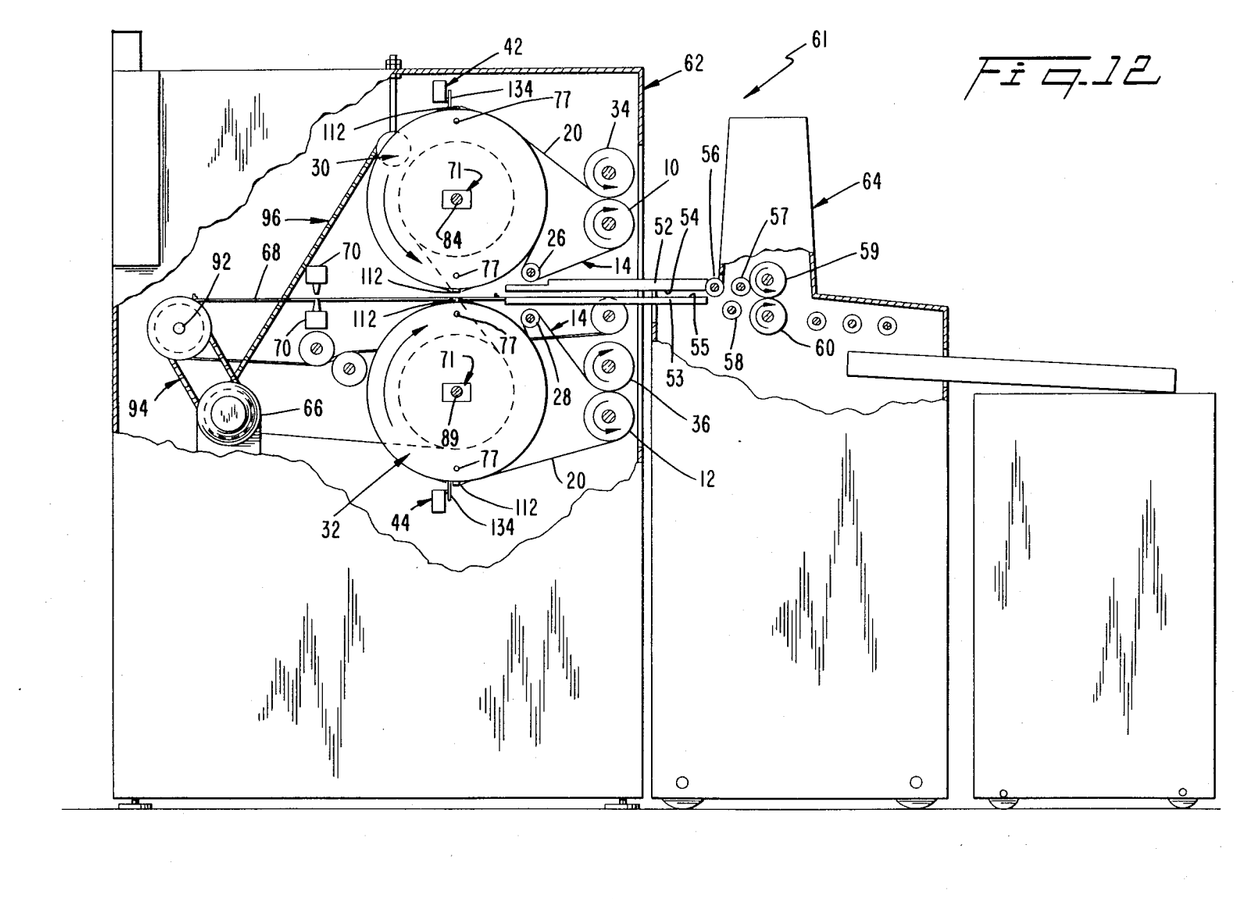
FIG. 12 is a side view of the apparatus having portions broken away to illustrate the construction thereof embodying certain principles of the invention.

Referring to FIG. 12, there is illustrated an apparatus, designated generally by the numeral 61, for precisely positioning and applying sheets 46 and 48 (FIGS. 3 through 11) to the rigid board 51. Apparatus 61 includes a feeder section, designated generally by the numeral 62, and a laminating section, designated generally by the numeral 64. The feeder section 62 includes (1) a motor 66, (2) vacuum drums 30 and 32, (3) a conveyor 68 for advancing the board 51 through the section 62, (4) a vacuum brush unit 70 for cleaning the advancing boards and (5) the sheet severing systems 42 and 44. The feeder section 62 also includes a rotary actuator, designated generally by the numeral 71 and a plurality of cam systems, designated generally by the numeral 72 (FIG. 13) which facilitates lateral movement of vacuum drums 30 and 32. Rotary actuator 71 facilitates the conversion of linear motion into rotary motion which is necessary to operate the cam systems 72.

Figure 13:
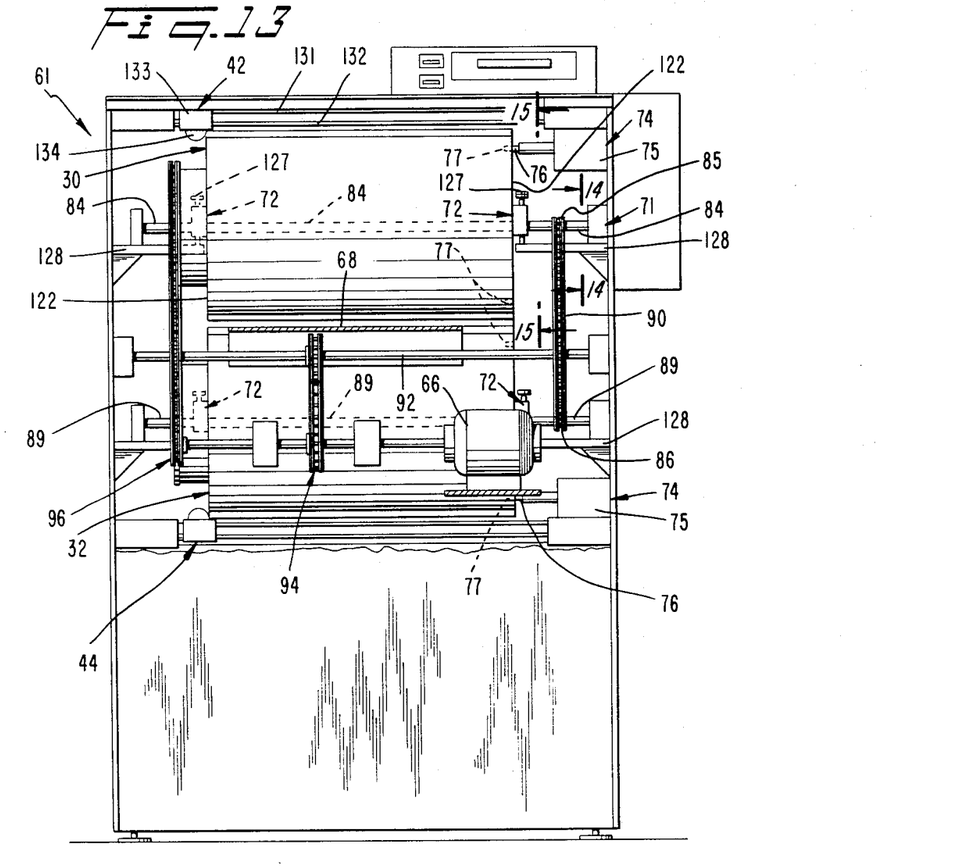
FIG. 13 is a front view of the apparatus of FIG. 11.

Referring to FIG. 13, apparatus 61 also includes a drum locking system 74 which prevents vacuum drums 30 and 32 from rotating during the operation of severing systems 42 and 44. The locking system 74 includes an air cylinder 75 which operates a locking pin 76. Each of the drums 30 and 32 includes a pair of diametrically opposed apertures 77 (FIG. 12). Prior to the activation of the severing systems 42 and 44, the locking pin 76 enters into one of the apertures 77 on each of the drums 30 and 32 to secure the drums against rotational movement.

Figure 14:
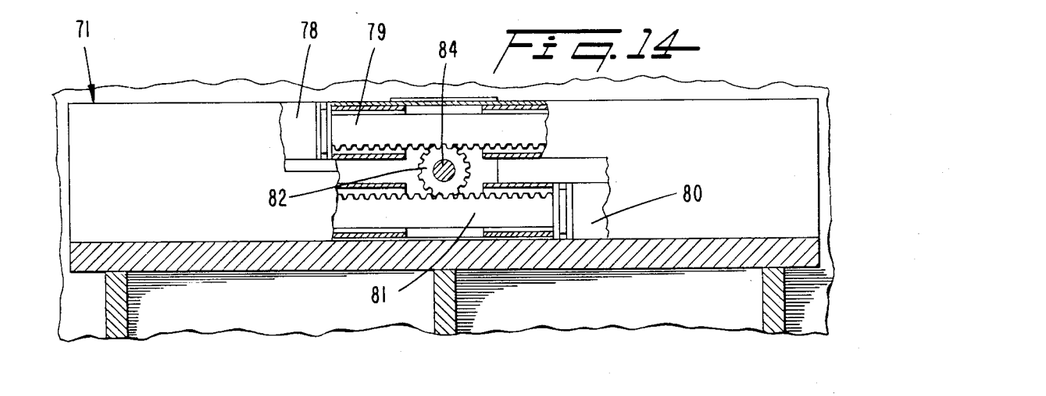
FIG. 14 is a view of a rotary actuator taken along lines 13—13 having portions broken away to illustrate the construction thereof.

Referring to FIG. 14, the rotary actuator 71 includes (1) an upper air cylinder 78 which operates a rack 79, (2) a lower air cylinder 80 which operates a rack 81 and (3)

a pinion gear 82 which is positioned between racks 79 and 81 which facilitates the conversion of linear movement of the racks into rotary movement of the pinion gear. An upper cam shaft 84 is fixedly attached to the gear 82 and transmits the rotary movement of the gear 82 to the cam systems 72 (FIG. 13) associated with the drum 30. The rotary actuator 71 which performs in the foregoing manner is commercially available from PHD, Inc. of Fort Wayne, Ind. and is identified as a Rotary Actuator Model R-11 A.

Referring again to FIG. 13, a sprocket 85, which is fixedly attached to cam shaft 84, is coupled to a sprocket 86, which is fixedly attached to cam shaft 89, through a chain 90. When rotary actuator 71 is activated to operate cam shaft 84 and the cam systems 72 associated with vacuum drum 30, cam shaft 89 and the cam systems associated with drum 32 are simultaneously operated.

The motor 66 is coupled to a shaft 92 through a sprocket and chain system, designated generally by the numeral 94, to facilitate the operation of the conveyor 68. Motor 66 also facilitates the rotary movement of drums 30 and 32 through a chain and sprocket system, designated generally by the numeral 96.

Figure 15:
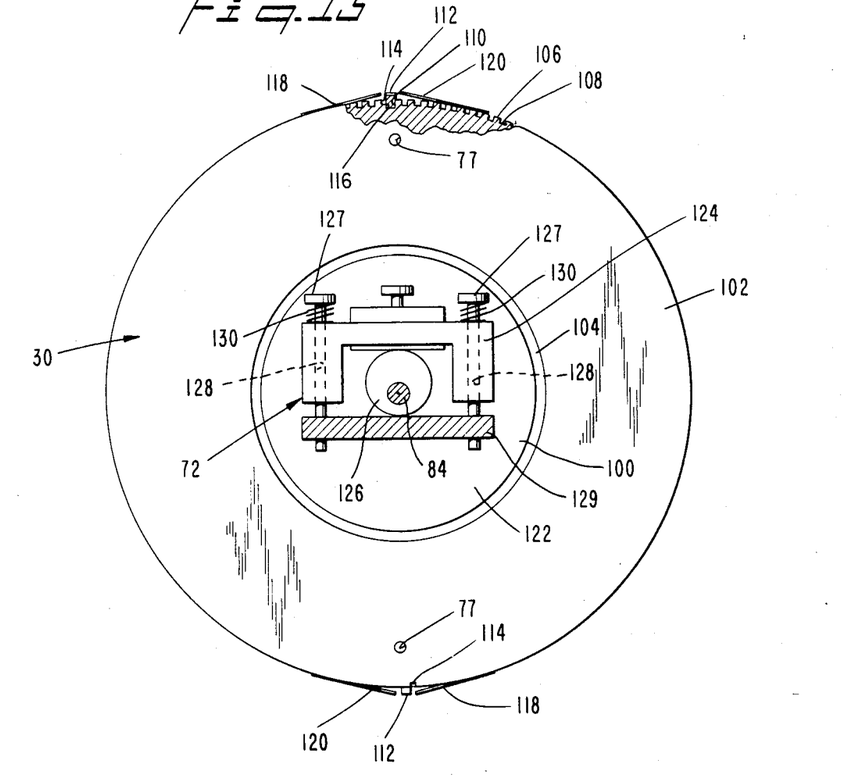
FIG. 15 is an end view of a vacuum drum showing a cam system mounted thereon.

Referring to FIG. 15, the details of drums 30 and 32 (FIG. 13) are identical, thus, only the details of drum 30 will be described. Vacuum drum 30, is formed by a stationary center member 100 and a rotatable outer member 102 separated by a bearing 104. Peripheral surface 106 of the outer member 102 is slotted and the member is formed with a plurality of vacuum holes 108 which extend to the interior of the drum 30. A pair of grooves 110 (one shown) are formed at diametrically spaced locations in the peripheral surface 106 of member 102 parallel to the axis of the drum 30. A pressure bar 112 is disposed in each of the grooves 110 and protrudes slightly outwardly from peripheral surface 106 of member 102. A cutter track 114 is formed in the surface 106 adjacent to a leading edge 116 of each of the grooves 110 to provide clearance for the severing system 42. Retractable ramps 118 and 120 are formed adjacent to the pressure bar 112 to support the trailing and leading ends, respectively, of sheets 46 (FIGS. 4 and 5) as they are severed from supply roll 10 (FIG. 12).

One of the cam systems 72 is mounted on each end wall 122 (one shown) of center member 100 of drum 30 and includes a cam follower 124 which is fixedly attached to the center member. An eccentric 126, which is fixedly attached to the cam shaft 84, is positioned below the cam follower 124. A pair of pins 127, which are positioned within a pair of channels 128 formed through the cam follower 126, are threadly attached to a bracket 129. Spring members 130, which are positioned around each pin 127, bias the cam follower 124 in a downward direction as viewed in FIG. 15.

Figure 16:
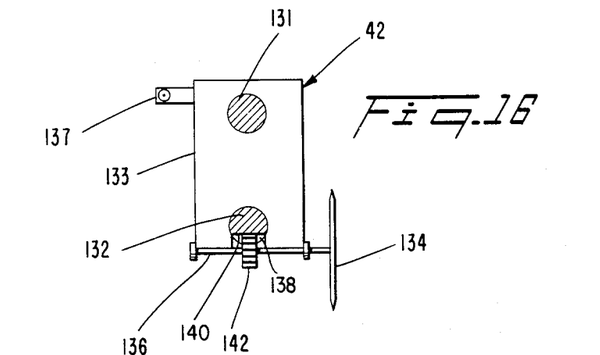
FIG. 16 is a side view showing a system for severing sheets from supplies of the composite of FIG. 1.

Referring to FIG. 16, the details of the severing systems 42 and 44 (FIG. 13) are identical, thus, the details of system 42 only will be described. System 42, which is mounted for sliding movement on spaced parallel rods 131 and 132, includes a body portion 133 and a circular cutting blade 134 secured to a shaft 136. The body portion 133 includes an arm 137 extending from one side thereof to which a cable (not shown) is attached. The cable is coupled to an air cylinder (not shown) which facilitates a traversing movement of the severing system 42 along rods 131 and 132. Rod 132 has a plurality of teeth 138 formed in a lower surface 140 thereof which mesh with a gear 142 fixedly attached to the shaft 136.

Thus, as the severing system 42 traverses across the drum 30 to facilitate the severing of the laminate 39, the meshing of the gear 142 with the teeth 138 causes the cutting blade 134 to rotate. Moreover, as the severing system 42 traverses the drum 30, the cutting blade 134 is disposed within cutter track 114 (FIG. 15). It is noted that the cutting blade 134 is rotated in such a direction that the blade is moved upwardly out of the cutter track 114 at the point where the laminate 39 is severed to form sheet 46 so as to sever the laminate from the underside thereof. This process provides a smooth separation of the laminate 39 along a cut-line. If the blade 134 had been rotated in the reverse direction, the blade would have severed from the exposed side of the laminate 39 which would have forced the laminate into the cutter track 114 resulting in a rough-edge cut of the laminate in forming the sheet 46.

Figure 4:
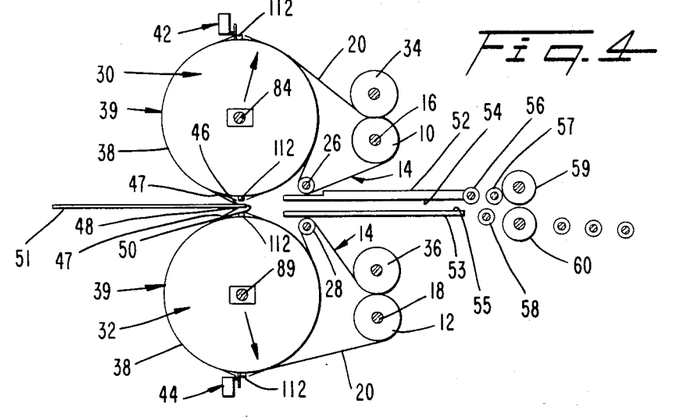

In use, the composites 14 are fed from supply rolls 10 and 12 and around rollers 26 and 28, respectively, whereafter the upper layers 20 of film are separated from the photoresist layers 22 and are wound onto take-up rollers 34 and 36. The remaining layers 22 and 24 form the laminates 39. The laminates 39 are then brought into intimate contact with surfaces 106 of vacuum drums 30 and 32, whereat a vacuum pressure is applied to the drums to hold the laminates thereon. Each of the laminates 39 is oriented on the respective one of the drums 30 and 32 such that the leading edge 40 of each laminate overlays one of the pressure bars 112 associated with each of the drums and are aligned with edge 116 of one of the grooves 110 which is adjacent to the respective one of the pressure bars. Vacuum drums 30 and 32 are then rotated until the leading edges 40 of the laminates 39 brought into an opposed relationship as viewed in FIG. 2. Thereafter, the locking system 74 is activated to secure the drums 30 and 32. Sheet severing systems 42 and 44 are activated to form sheets 46 and 48, respectively, from supply rolls 10 and 12, respectively. The locking system 74 is then deactivated. The rigid board 51 is then placed on the conveyor 68 so that the leading edge 50 of the board is disposed adjacent the leading edge 40 of each of sheets 46 and 48. Rotary actuator 71 is then activated which facilitates the movement of drums 30 and 32 toward each other as illustrated in FIG. 3 until pressure bars 112 press the leading edges 40 of each of the sheets 46 and 48 are into attachment with the leading edge 50 of the board 51. Thereafter, the rotary actuator 71 reverses its rotary motion to move the drums 30 and 32 apart as illustrated in FIG. 4 so that the remaining portions of the sheets 46 and 48 do not touch and adhere to the board 51.

The conveyor 68 advances the board 51 between the drums 30 and 32 as the drums are indexed in the direction illustrated in FIG. 5. As the leading edge 50 of the board 51 passes beneath the vacuum shoe 52, vacuum pressure, which is applied to the vacuum shoe, facilitates the gripping and extending of the remaining portions of sheet 46 above the board to a substantially wrinkle-free condition and to preclude premature adhesive engagement of the sheet with the board. As the board 51 is advanced further beneath the vacuum shoe 52, sheet 46 slides along the lower surface 54 thereof while sheet 48 slides along surface 55 of shelf 53. The vacuum tensioning tube 56 facilitates the transfer of sheet 46 from the lower surface 54 of the vacuum shoe 52 toward the board 51. The board 51 is then advanced between vacuum bars 57 and 58, which facilitates the transfer of sheets 46 and 48, respectively, further toward the board and to maintain the sheets in the wrinkle-free condition. Immediately thereafter, laminating rollers 59 and 60 facilitate the adhesive attaching of the sheets 46 and 48 to the board 51. The drums 30 and 32 are now positioned so that another pair of sheets 46 and 48 can be severed from laminates 39 and the leading edges 40 can be attached to the next board 51.

What is claimed is:

1. A method of applying a sheet to a rigid board which comprises the steps of:

placing the sheet onto a rotatable drum prior to attaching the sheet to the board;

holding the sheet on the drum;

indexing the drum to a selected position so that a leading edge of the sheet is positioned for the attaching thereof to a leading edge of the board;

positioning the leading edge of the sheet on the drum so that the leading edge overlays and is aligned with a pressure bar fixedly secured to the drum and which protrudes slightly outwardly from the surface of the drum;

moving the drum toward the rigid board so that the pressure bar presses the leading edge of the sheet into attachment with the leading edge of the board;

developing slack in the portion of the sheet immediately adjacent to the leading edge thereof as the leading edge of the sheet is being moved toward and into attachment with the leading edge of the board;

extending the remaining portion of the sheet in a position adjacent to but spaced from the rigid board in a wrinkle-free condition;

preventing any premature attachment between the remaining portion of the sheet and the board; and maintaining the wrinkle-free condition of the sheet while securing successive sections of the remaining portion of the sheet to the board.

2. Apparatus for applying a sheet to a rigid board which comprises:

a rotatable drum;

means for placing the sheet onto the rotatable drum prior to attaching the sheet to the board;

means for holding the sheet on the drum;

means for indexing the drum to a selected position so that a leading edge of the sheet is positioned for the attaching thereof to a leading edge of the rigid board;

a pressure bar fixedly secured to the drum and which protrudes slightly outwardly from the surface of the drum;

means for positioning the leading edge of the sheet on the drum so that the leading edge overlays and is aligned with the pressure bar;

means for moving the drum toward the rigid board so that the pressure bar presses the leading edge of the sheet into attachment with the leading edge of the board;

means, included within the means for moving the drum, for moving the drum in a direction relative to the rigid board to develop slack in the portion of the sheet immediately adjacent to the leading edge thereof as the leading edge of the sheet is being moved toward and into attachment with the leading edge of the board;

means for extending the remaining portion of the sheet in a position adjacent to but spaced from the rigid board in a wrinkle-free condition;

means for preventing any premature attachment between the remaining portion of the sheet and the board;

means for maintaining the wrinkle-free condition of the sheet; and means for securing successive sections of the remaining portion of the sheet to the board while the sheet is maintained in the wrinkle-free condition.

* * * * *